United States Patent
Templeton et al.

(10) Patent No.: US 6,316,804 B1
(45) Date of Patent: Nov. 13, 2001

(54) OXYGEN IMPLANT SELF-ALIGNED, FLOATING GATE AND ISOLATION STRUCTURE

(75) Inventors: Michael K. Templeton, Atherton; Kathleen R. Early, Santa Clara, both of CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/569,721

(22) Filed: May 11, 2000

Related U.S. Application Data

(62) Division of application No. 09/057,992, filed on Apr. 9, 1998, now Pat. No. 6,066,530.

(51) Int. Cl.$^7$ .................................................. H01L 29/788
(52) U.S. Cl. .......................... 257/315; 257/316; 257/506; 257/513
(58) Field of Search ................................. 257/315–321, 257/506, 513; 438/257–267

(56) References Cited

U.S. PATENT DOCUMENTS

| | | |
|---|---|---|
| 5,015,601 * | 5/1991 | Yoshikawa . |
| 5,599,727 * | 2/1997 | Hakozaki et al. . |
| 5,731,237 * | 3/1998 | Sato ..................................... 438/257 |
| 5,851,881 * | 12/1998 | Lin et al. .............................. 438/261 |
| 6,013,551 * | 1/2000 | Chen et al. ........................... 438/264 |

* cited by examiner

Primary Examiner—Richard Booth
(74) Attorney, Agent, or Firm—LaRiviere, Grubman & Payne, LLP

(57) ABSTRACT

A semiconductor apparatus and fabrication method for forming oxide isolation regions in a semiconductor substrate for use in forming self-aligned, floating gate MOS structures or other semiconductor devices. The method includes providing a semiconductor substrate member prefabricated having a barrier oxide layer, a polysilicon layer and a plurality of spaced apart silicon nitride layer portions fabricated on the polysilicon layer. The nitride layer portions delineate regions for forming the self-aligned floating gate MOS structures, as well as delineating portions of the silicon dioxide layer and portions of said polysilicon layer that are unprotected by the plurality of silicon nitride layer portions. The method further includes the step of implanting oxygen $O_2$ ions into regions of the substrate, including those unprotected portions of the silicon dioxide layer and portions of the polysilicon layer to form the oxide isolation regions. After removing the silicon nitride layer portions, and exposing the polysilicon layer portions, the implanted structure is annealed and made ready for forming the self-aligned floating gate MOS structures, or other semiconductor structure on the conductive material pads. The floating gates may be formed having a minimal width with respect to an underlying active region.

12 Claims, 3 Drawing Sheets

OXYGEN IMPLANT SELF-ALIGNED, FLOATING GATE AND ISOLATION STRUCTURE

RELATED APPLICATION

This application is a divisional patent application of co-pending U.S. patent application Ser. No. 09/057,992, entitled: "OXYGEN IMPLANT SELF-ALIGNED, FLOATING GATE AND ISOLATION STRUCTURE", filed Apr. 9, 1998, now U.S. Pat. No. 6,066,530 by the same applicants.

TECHNICAL FIELD

The present invention relates to integrated circuits and fabrication techniques for forming field oxide (FOX) regions on the integrated circuit substrate. More particularly, the present invention relates to fabrication techniques for forming field oxide regions that facilitate forming self-aligned, floating gates on the integrated circuit substrate.

BACKGROUND OF THE INVENTION

The processes for fabricating MOS (metal oxide semiconductors) devices includes process steps for forming isolation regions that contain dielectric materials that provide the necessary protection for assuring proper function of the formed electronic integrated circuits, such as by minimizing leakage currents between individual devices. The various processes includes LOCOS which is an abbreviation for localized oxidation of silicon. The LOCOS process typically begins by depositing a silicon nitride layer over a silicon dioxide layer to a thickness in the range of 0.05 $\mu$m. to 0.20 $\mu$m. The silicon nitride layer is typically deposited using low-pressure chemical vapor deposition (LPCVD) techniques. A photoresist mask layer, comprising any appropriate commercially available photoresist material is then deposited over the silicon nitride layer and patterned by methods known in the industry. After etching the unprotected silicon nitride portions delineated by the photoresist mask and stripping the photoresist mask, a plurality of spaced apart silicon nitride regions remain on the substrate, see generally FIG. 1. The silicon nitride regions prevent oxidation of the underlying regions during a thermal oxidation process used to grow oxide isolation regions, see generally FIG. 2. The thickness of the grown oxide isolation regions is on the order of 0.10 $\mu$m to 0.50 $\mu$m. Subsequent to the formation of the oxide isolation regions the silicon nitride and silicon dioxide layer regions are removed by selectively wet etching to expose the active region which will be used to form the various integrated circuit components. The wet etching is typically done using hot phosphoric acid to first selectively etch the silicon nitride layer, then by dipping the substrate in a hydrofluoric acid (HF) dip to primarily etch away the silicon thin dioxide layer and prepare a clean surface upon which to form a uniform thin oxide. The process continues by growing a thin oxide layer that primarily covers the exposed active region, but also adds to the thickness of the previously grown oxide isolation regions. By example, the process further continues by deposition of a polysilicon layer over the oxide isolation regions and the thin oxide layer. FIG. 3 shows a substrate structure after having applied a photoresist mask for defining the polysilicon layer over the active region and thus forming a floating gate region.

As seen from the foregoing, formation of the oxide isolation region, in accordance with prior art techniques, involves an etching process that removes the oxide and silicon nitride in regions adjacent to those that will protect the active substrate regions during the subsequent LOCOS process. The prior art process involves a substantial number of fabrication steps that impact the cost of the product. Thus, a need is seen to exist for a method of forming the oxide isolation regions without etching and that minimizes the fabrication steps to produce semiconductor devices. Further, in order to maximize the number of devices that can fit into a given area, it is desirable to make floating gates as small as possible. For good electrical properties this means that the floating gates should be just large enough to cover the active areas beneath them. However, in practice, and since the floating gate and the active area structures are formed in two separate masking steps, the floating gate mask can be misaligned with respect to the active area. As a consequence, the floating gate has to be made larger than the ideal minimum size to account for manufacturing tolerances in aligning the two masking layers, as well as for size variations in the floating gate and active region that occur as a natural part of the masking process.

Accordingly, a primary object of the present invention is to provide a method for forming oxide isolation regions without etching and that minimizes the fabrication steps to produce semiconductor device, such as semiconductor devices having a floating gate structure.

Accordingly, another primary object of the present invention is to provide a method that defines a floating gate and active area simultaneously with one mask and thereby allowing formation of a minimum-sized floating gate structure.

BRIEF SUMMARY OF THE INVENTION

Accordingly, the foregoing object is accomplished by providing a semiconductor apparatus and fabrication method for forming oxide isolation regions in a semiconductor substrate for use in forming self-aligned floating gate MOS structures, or other semiconductor devices. The method includes providing a semiconductor substrate member prefabricated having an oxide layer, a polysilicon layer and a plurality of silicon nitride layer portions fabricated on the polysilicon layer. The spaced apart silicon nitride layer not only delineate, by covering, active regions for forming the self-aligned floating gate MOS structures, they also delineate portions of the silicon dioxide layer and portions of said polysilicon layer that are unprotected by the plurality of spaced apart silicon nitride layer portions. The method further includes the step of implanting oxygen $O_2$ ions into the substrate, in particular the regions that are unprotected by the silicon nitride. The implanting energy and concentration of oxygen ions penetrates the unprotected portions of the silicon dioxide layer and portions of the polysilicon layer to form the isolation regions in the underlying silicon substrate. After removing the silicon nitride layer portions, and exposing the polysilicon layer portions, the implanted structure is annealed and made ready for completing the self-aligned floating gate MOS structures, or other semiconductor structure on the conductive material regions.

Other features of the present invention are disclosed or apparent in the section entitled: DETAILED DESCRIPTION OF THE INVENTION.

BRIEF DESCRIPTION OF DRAWINGS

For fuller understanding of the present invention, reference is made to the accompanying drawing in the following Detailed Description of the Invention. In the drawings:

FIG. 1 illustrates, in cross-section, a semiconductor substrate patterned with material for forming the oxide isolation regions, also referred to as field oxide regions.

FIG. 2 illustrates, in cross-section, the field oxide regions subsequently grown on the substrate.

FIG. 3 illustrates, in cross-section, a prior art semiconductor substrate having field oxide regions and formed to a stage having a photoresist mask for defining a polysilicon layer.

Figure 1:
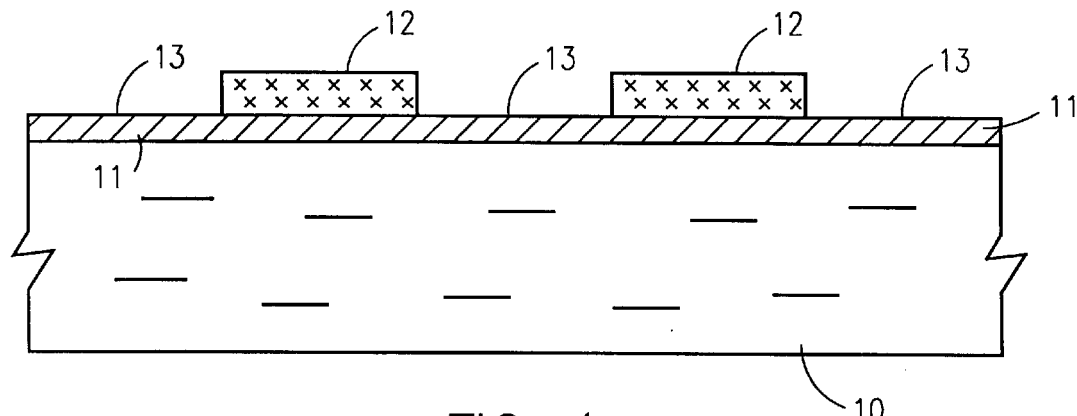
FIGS. 1–3 illustrate the prior art fabrication steps for forming oxide isolation regions.

Reference numbers refer to the same or equivalent parts of the present invention throughout the several figures of the drawing.

DETAILED DESCRIPTION OF THE INVENTION

Figure 2:
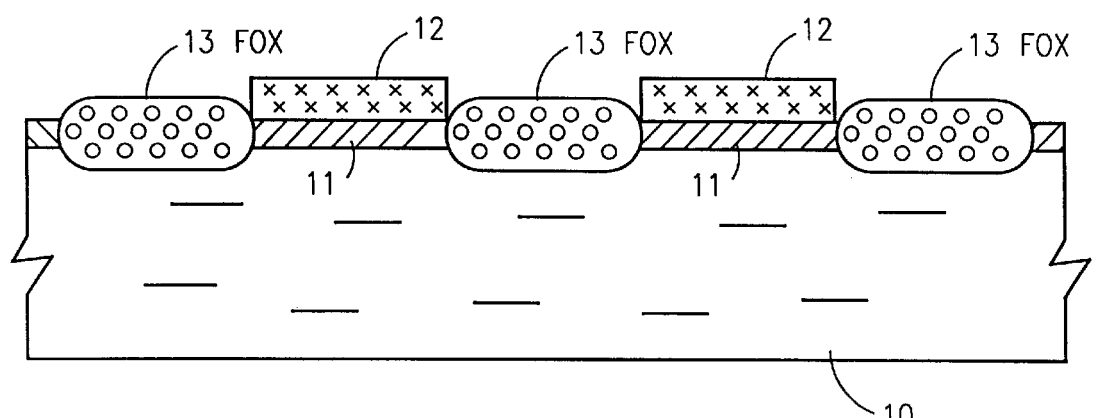
Figure 3:
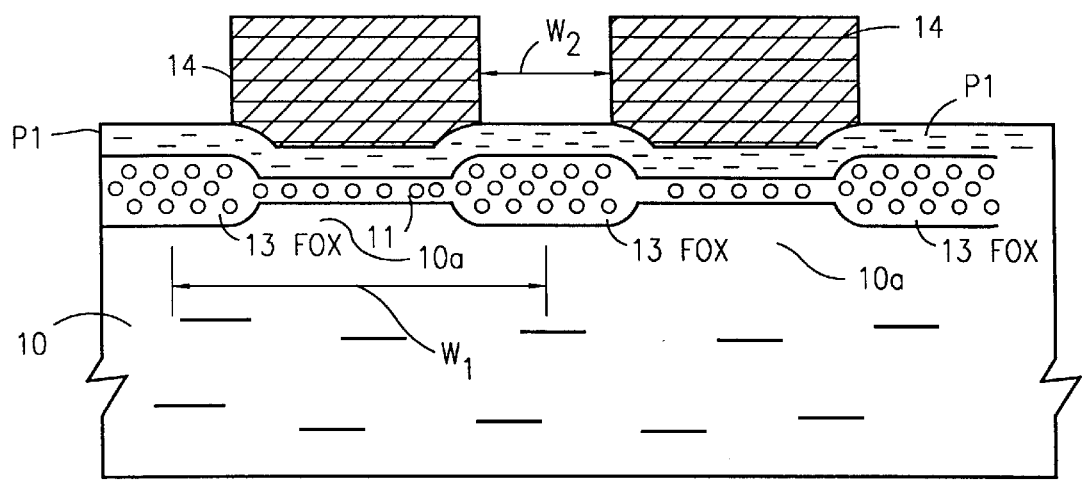
Figure 3A:
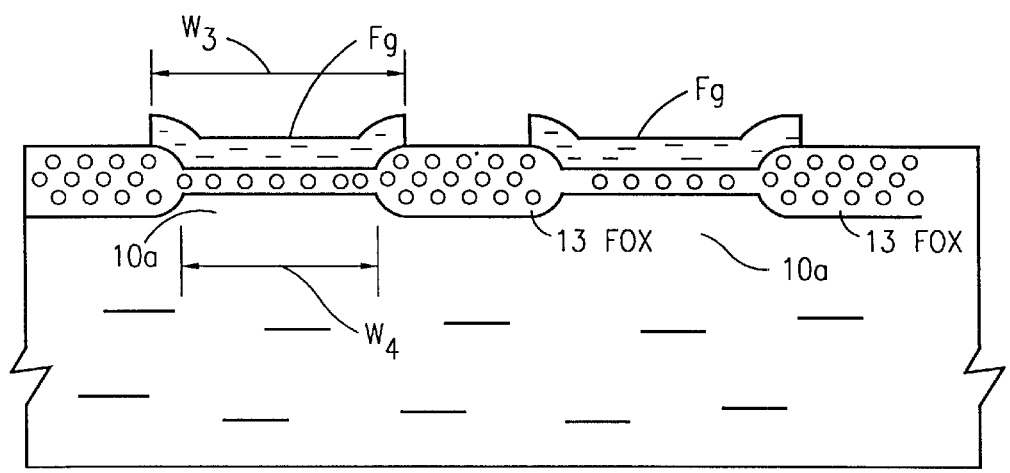
FIG. 3a illustrates, in cross-section, a prior art semiconductor substrate at a fabrication stage having a floating gate structure made larger than the ideal minimum size.

Referring now to the drawings where FIGS. 1–3a illustrate the prior art fabrication steps for forming isolation regions. FIG. 1 in particular illustrates, in cross-section, a semiconductor substrate 10 patterned with material for forming field oxide regions. As noted previously, a LOCOS process is typically employed to form the oxide isolation regions and typically begins by deposition a silicon nitride 12 layer over a silicon dioxide layer 11. The silicon nitride layer 12 is masked using a photoresist and patterned by etching to form regions 13 which delineate where the oxide isolation regions $13_{FOX}$ will be formed. Upon etching the photoresist material, an plurality of spaced apart silicon nitride regions 12 remain on the substrate, see generally FIG. 1. The silicon nitride regions 13 prevent oxidation of the underlying regions during a thermal oxidation process used to grow oxide isolation regions $13_{FOX}$, see generally FIG. 2. As shown in FIG. 2, the oxide isolation regions $13_{FOX}$ are formed adjacent to the silicon oxide layer 11 and the silicon nitride layer 12 regions. The oxide isolation regions $13_{FOX}$ comprise an oxide layer formed by growing a thick layer of silicon dioxide using a high temperature thermal oxidation process. As noted previously, the thickness of oxide region $13_{FOX}$ is in the range of 0.10 $\mu$m to 0.50 $\mu$m. Subsequent to formation of the oxide regions $13_{FOX}$, the silicon nitride layer 12 and silicon dioxide layer regions 11 are removed by wet etching to expose the active substrate region which will be used to form the various integrated circuit components. By example, FIG. 3 illustrates, in cross-section, a prior art semiconductor substrate with oxide isolation regions $13_{FOX}$, a thin layer of oxide 11 formed over an active region 10a, and a polysilicon layer P1 formed over the thin oxide layer 11. Also illustrated in FIG. 3, is a photoresist mask 14 used to define polysilicon layer P1 by subsequent etching and formation of the floating gate portion $F_G$ of a floating gate MOS device, see generally FIG. 3a. As seen in FIG. 3, the oxide isolation regions $13_{FOX}$ are spaced apart a distance w1, by example 600 nm, beneath the oxide and polysilicon layer P1. As noted previously, a prior art floating gate structure $F_G$ has to be made larger than the ideal minimum size, i.e. the width of the active region 10a. Thus, as best seen in FIG. 3a, to assure sufficiently wide placement w3 of the floating gate portion $F_G$ with respect to the width w4 of active area 10a, the photoresist masks 14 are spaced a distance w2 and controlled at a tolerances of ±100 nm, as shown in FIG. 3.

Figure 4:
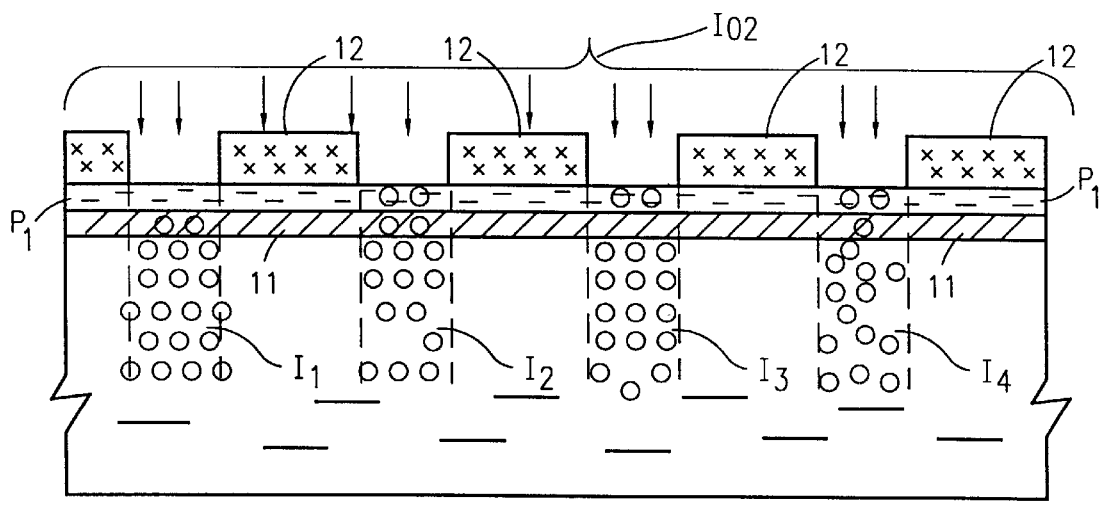
FIG. 4 illustrates the present invention at a stage of implanting the oxygen ions after depositing the oxide and polysilicon and having patterned regions where the oxide isolation regions are to be formed.

FIG. 4 illustrates the present invention in accordance with the primary object of forming oxide isolation regions without etching and which minimizes the fabrication steps to produce semiconductor device, such as semiconductor devices having a floating gate structure.

Figure 5:
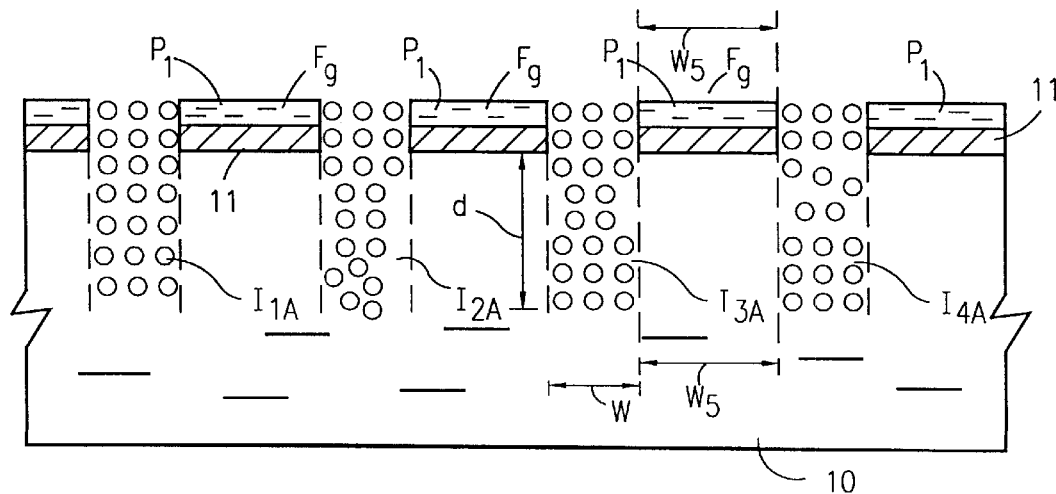
FIG. 5 illustrates the present invention after stripping the patterning material and after annealing the implanted structure.

As illustrated in FIG. 4a semiconductor substrate member 10 is prefabricated having a barrier oxide layer 11, at least one polysilicon layer P1 and a plurality of silicon nitride layer portions 12. The spaced apart silicon nitride layer portions 12 not only delineate, by covering regions of barrier oxide layer 11 and polysilicon layer P1 for forming the self-aligned floating gate MOS structures, the nitride layers 12 also delineate portions of the silicon dioxide layer 11 and portions of said polysilicon layer P1 that are unprotected and which facilitate formation of the isolation regions in accordance with the present invention. FIG. 4 also shows an implanting step $I_{O2}$ for implanting oxygen $O_2$ ions into substrate regions, by example regions $I_1, I_2, I_3$ and $I_4$, through the layer regions that are unprotected by the silicon nitride. The implanting energy and concentration of oxygen ions penetrates the unprotected portions of the silicon dioxide layer 11 and portions of the polysilicon layer P1 to form the isolation regions $I_1, I_2, I_3$ and $I_4$ in the underlying silicon substrate. The formation of isolation regions $I_1, I_2, I_3$ and $I_4$ comprises implanting oxygen $O_2$ ions into substrate 10 to a depth d ranging from 0.0 Å to 3000 Å, at an energy ranging from 50 to 250 KeV, and an oxygen ion concentration ranging from $1 \times 10^{20}$ to $1 \times 10^{22}$ atom/cm$^3$. FIG. 5 shows the implanted substrate structure 10 after removing the silicon nitride layer portions 12, and exposing the polysilicon layer portions P1. The implanted structure 10 is annealed by example, by a rapid thermal anneal process (RTA), at a 950° C. temperature for a one (1) minute duration. As seen in FIG. 5, the substrate 10 comprises stable isolation regions $I_1, I_2, I_3$ and $I_4$ and are in ready state for forming the self-aligned floating gate MOS structures Fg, or other semiconductor structure on the polysilicon P1 material. Thus, the present invention facilitates being able to control the sub-micron width w of the isolation regions $I_1, I_2, I_3$ and $I_4$ and further facilitates forming floating gate structures Fg such that they are minimally sized to a width w5 that is the same width as the underlying active region 10a.

The present invention has been particularly shown and described with respect to a certain preferred embodiment and features thereof. However, it should be readily apparent to those of ordinary skill in the art that various changes and modifications in form, semiconductor material, material conductivity type i.e. N-type, or P-type, and detail may be made without departing from the spirit and scope of the inventions as set forth in the appended claims. The inventions illustratively disclosed herein may be practiced without any element which is not specifically disclosed herein.

What is claimed is:

1. A semiconductor device, said device comprising:

a semiconductor substrate member having at least one active region;

at least one pair of spaced apart regions of electrically conductive material formed on said semiconductor member; and an electrical isolation region, said upper region comprising an oxide material and a semiconductor material doped with oxide ions having an upper region and a lower region, said upper region and said lower region comprising an anisotropic electrical isolation region being formed by an oxide ion implant process followed by an anneal process, and said anisotropic electrical isolation region comprising an anisotropic oxide concentration profile, said anisotropic oxide concentration profile being defined at an upper surface of said substrate member.

2. The semiconductor device, as recited in claim 1, wherein said upper region comprises:

a silicon dioxide portion; and a polysilicon portion, wherein said device further comprises at least one floating gate MOS structure formed from said at least one pair of spaced apart regions of electrically conductive material, said at least one floating gate MOS structure having a floating gate width, said at least one active region having an active region width, and wherein said floating gate width and said active region width are equal.

3. The semiconductor device, as recited in claim 1, wherein said anisotropic electrical isolation region comprises a sub-micron width dimension and a depth dimension ranging from 0.0 Å to 3000 Å, wherein said device further comprises at least one floating gate MOS structure formed from said at least one pair of spaced apart regions of electrically conductive material, said at least one floating gate MOS structure having a floating gate width;

said at least one active region having an active region width, and wherein said floating gate width and said active region width are equal.

4. The semiconductor device, as recited in claim 1, wherein said at least one pair of spaced apart regions of electrically conductive material comprises an undoped polysilicon material deposited over a silicon dioxide material layer for facilitating formation of a floating gate MOS structure, and wherein said device further comprises said at least one floating gate MOS structure formed from said undoped polysilicon material.

5. A semiconductor device, said device comprising:

a semiconductor substrate member having at least one active region;

at least one a pair of spaced apart regions of electrically conductive material formed on said semiconductor member;

an upper region of an electrical isolation region, said upper region comprising a silicon dioxide material and a polysilicon material doped with oxide ions; and a lower region of said electrical isolation region, said upper region and said lower region comprising an anisotropic electrical isolation region formed by an oxide implant process followed by an anneal process, and said anisotropic electrical isolation region comprising an anisotropic oxide concentration profile, said anisotropic oxide concentration profile being defined at an upper surface of said substrate member.

6. The semiconductor device, as recited in claim 5, wherein said anisotropic isolation region comprises a sub-micron width dimension and a depth dimension ranging from 0.0 Å to 3000 Å, wherein said device further comprises at least one floating gate MOS structure formed from said at least one pair of spaced apart regions of electrically conductive material, said at least one floating gate MOS structure having a floating gate width, said at least one active region having an active region width, and wherein said floating gate width and said active region width are equal.

7. The semiconductor device, as recited in claim 6, wherein said at least one pair of spaced apart regions of electrically conductive material comprise a polysilicon material deposited over a silicon dioxide material for facilitating formation of a self-aligned floating gate MOS structure, and wherein said device further comprises at least one floating gate MOS structure formed from said polysilicon material.

8. A semiconductor device, said device comprising:

(a) a semiconductor substrate member having at least one active region;

(b) at least one pair of spaced apart regions of electrically conductive material formed on said semiconductor member; and (c) at least one anisotropic electrical isolation region formed between said at least one pair of spaced apart regions of electrically conductive material, said at least one anisotropic electrical isolation region comprising oxygen ions implanted into said semiconductor substrate member, wherein said semiconductor substrate member comprises a semiconductor substrate having silicon dioxide material and polysilicon material deposited over said silicon dioxide material, and wherein said anisotropic electrical isolation region comprising an anisotropic oxide concentration profile, said anisotropic oxide concentration profile being defined at an upper surface of said substrate member.

9. The semiconductor device, as recited in claim 8, wherein said implanted oxygen ions are annealed, and wherein said apparatus further comprises a self-aligned floating gate MOS structure formed from said at least one pair of spaced apart electrically conductive material regions.

10. The semiconductor device, as recited in claim 8, wherein said at least one anisotropic electrical isolation region comprises oxygen ions implanted into said semiconductor substrate member to a depth ranging from 0.0 Å to 3000 Å, at an energy ranging from 50 to 250 KeV, and an oxygen ion concentration ranging from $1\times10^{20}$ to $1\times10^{22}$ atoms/cm$^3$.

11. A semiconductor device comprising:

(a) a semiconductor substrate member, having at least one active region, said substrate member also comprising a silicon dioxide material and a polysilicon material deposited over said silicon dioxide material and also having a plurality of spaced apart portions of a silicon nitride regions fabricated on said polysilicon material which delineate at least one active region for facilitating formation of at least one self-aligned floating gate MOS structure;

(b) at least one pair of spaced apart regions of electrically conductive material on said semiconductor member;

(c) an anisotropic electrical isolation region formed between said at least one pair of spaced apart regions of electrically conductive material said anisotropic electrical isolation region comprising oxygen ions implanted into said semiconductor substrate member;

(d) at least one self-aligned floating gate MOS structure formed from said at least one pair of spaced apart electrically conductive material regions, wherein said implanted oxygen ions are annealed, and said anisotropic electrical isolation region comprising an anisotropic oxygen concentration profile, said anisotropic oxide concentration profile being defined at an upper surface of said substrate member.

12. The semiconductor device, as recited in claim 11, comprising:

regions for forming a self-aligned floating gate MOS structure;

wherein said oxygen ions are implanted into and through portions of said silicon dioxide material and portions of said polysilicon material that are unprotected by said plurality of silicon nitride portions, said oxygen ions being implanted to a depth ranging from 0.0 Å to 3000 Å, at an energy ranging from 50 to 250 KeV, and an oxygen ion concentration ranging from $1\times10^{20}$ to $1\times10^{22}$ atoms/cm$^3$, wherein said at least one electrically conductive material region comprises exposed polysilicon material after removal of said plurality of silicon nitride portions, wherein said substrate member is annealed, wherein said implanted oxygen ions are incorporated into said substrate member with an anisotropic oxygen concentration profile, said at least one floating gate MOS structure having a floating gate width, said at least one active region having an active region width, and wherein said floating gate width and said active region width are equal.

* * * * *

UNITED STATES PATENT AND TRADEMARK OFFICE
CERTIFICATE OF CORRECTION

PATENT NO. : 6,316,804 B1
DATED : November 13, 2001
INVENTOR(S) : Michael K. Templeton and Kathleen R. Early It is certified that error appears in the above-identified patent and that said Letters Patent is hereby corrected as shown below:

Column 3,
Line 40, after the word "regions" delete "13" and replace with -- 12 --;

Column 4,
Lines 38/39 and 43, after the word "regions" delete "$I_1$, $I_2$, $I_3$ and $I_4$" and replace with -- $I_{1A}$, $I_{2A}$, $I_{3A}$ and $I_{4A}$ --;

Signed and Sealed this

Eleventh Day of June, 2002

*Attest:*

JAMES E. ROGAN
*Attesting Officer*     *Director of the United States Patent and Trademark Office*